(12) United States Patent
Mori

(10) Patent No.: US 8,276,027 B2
(45) Date of Patent: Sep. 25, 2012

(54) SEMICONDUCTOR MEMORY AND METHOD FOR TESTING THE SAME

(75) Inventor: Kaoru Mori, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 44 days.

(21) Appl. No.: 13/050,633

(22) Filed: Mar. 17, 2011

(65) Prior Publication Data

US 2011/0167307 A1 Jul. 7, 2011

Related U.S. Application Data

(62) Division of application No. 11/797,699, filed on May 7, 2007, now Pat. No. 7,937,630.

(30) Foreign Application Priority Data

May 19, 2006 (JP) .................................. 2006-140032

(51) Int. Cl.
*G11C 29/00* (2006.01)

(52) U.S. Cl. ......................................................... 714/718

(58) Field of Classification Search .................. 714/718, 714/763, 764, 768, 3, 6.1; 365/201
See application file for complete search history.

(56) References Cited

U.S. PATENT DOCUMENTS

| 4,156,278 | A | 5/1979 | Wilhite |
| 5,886,658 | A * | 3/1999 | Amar et al. .................. 341/155 |
| 6,343,048 | B1 | 1/2002 | Jung |
| 6,400,625 | B2 | 6/2002 | Arimoto et al. |
| 6,487,629 | B1 | 11/2002 | Shibata |
| 7,516,384 | B2 | 4/2009 | Jeong et al. |
| 2003/0099143 | A1 | 5/2003 | Fujioka et al. |
| 2003/0198098 | A1 | 10/2003 | Fujioka et al. |
| 2005/0039073 | A1 * | 2/2005 | Hartmann .......................... 714/6 |
| 2012/0057420 | A1 * | 3/2012 | Mori .............................. 365/201 |

FOREIGN PATENT DOCUMENTS

| JP | 2000-67576 A | 3/2000 |
| JP | 2001-319500 A | 11/2001 |
| JP | 2004-5780 A | 1/2004 |
| TW | 594777 | 6/2004 |

OTHER PUBLICATIONS

Office Action from JP Application No. 2006-140032 and Partial Translation.

* cited by examiner

*Primary Examiner* — Phung M Chung
(74) *Attorney, Agent, or Firm* — Arent Fox, LLP

(57) ABSTRACT

A semiconductor memory in which arbitrary operation mode information is set in a plurality of CRs at test time and by which a test cost is reduced and a method for testing such a semiconductor memory. The plurality of CRs hold operation mode information. When a CR control circuit detects write commands to write to an address for register access or read commands to read from the address for register access in a predetermined order, the CR control circuit updates the operation mode information for each of the plurality of CRs on a time division basis. A command generation section generates the write commands, the read commands, or a test start command by which write operation or read operation does not occur, in response to a control signal from the outside. In addition, the command generation section regenerates the test start command each time the plurality of CRs are updated. A data pad compression circuit changes the operation mode information to be written to the plurality of CRs by using test data inputted to part of data pads, after inverting the test data or in its original condition according to a code, as data for a rest of the data pads, the code represented by part of an address inputted at the time of the test start command being sent.

4 Claims, 13 Drawing Sheets

CR-Key0

| DATA PAD | FUNCTION | Key | Description |
|---|---|---|---|
| DQ0 | CR Set / Verify | 0 | CR Verify |
| | | 1 | CR Set |
| DQ7-1 | — | | Reserved for future use |

CR-Key1

| DATA PAD | FUNCTION | Key | Description |
|---|---|---|---|
| DQ1, DQ0 | Partial Size | 0 0 | 32 M partial |
| | | 0 1 | 16 M partial |
| | | ⋮ | ⋮ |
| DQ4,DQ3,DQ2 | Burst Length | 000 to 001 | Reserved |
| | | 0 1 0 | 8 word |
| | | 0 1 1 | 16 word |
| | | ⋮ | ⋮ |
| | ⋮ | | |

CR-Key2

| DATA PAD | FUNCTION | Key | Description |
|---|---|---|---|
| DQ2,DQ1,DQ0 | Read Latency | 000 to 001 | Reserved |
| | | 0 1 0 | 4 clocks |
| | | 0 1 1 | 5 clocks |
| | | ⋮ | ⋮ |
| DQ3 | — | | Reserved |
| | ⋮ | | |

FIG. 2

| PAD ASSIGNED TO TESTER PIN | | SUBCODE | | |
|---|---|---|---|---|
| | | a08 | a09 | a10 |
| DQ0 | DQ0 | DQ2 | DQ4 | DQ6 |
| | DQ16 | DQ18 | DQ20 | DQ22 |
| DQ8 | DQ8 | DQ10 | DQ12 | DQ14 |
| | DQ24 | DQ26 | DQ28 | DQ30 |

| PAD ASSIGNED TO TESTER PIN | | SUBCODE | | |
|---|---|---|---|---|
| | | a11 | a12 | a13 |
| DQ5 | DQ5 | DQ1 | DQ3 | DQ7 |
| | DQ21 | DQ17 | DQ19 | DQ23 |
| DQ13 | DQ13 | DQ9 | DQ11 | DQ15 |
| | DQ29 | DQ25 | DQ27 | DQ31 |

FIG. 11

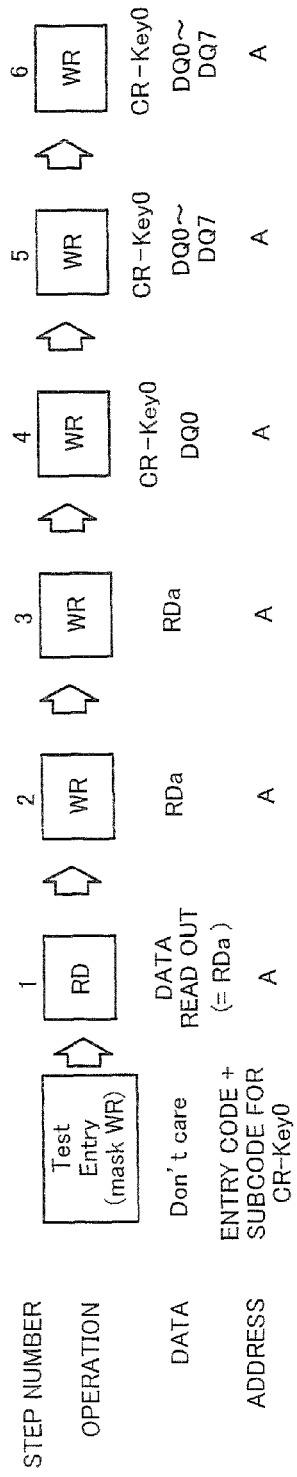
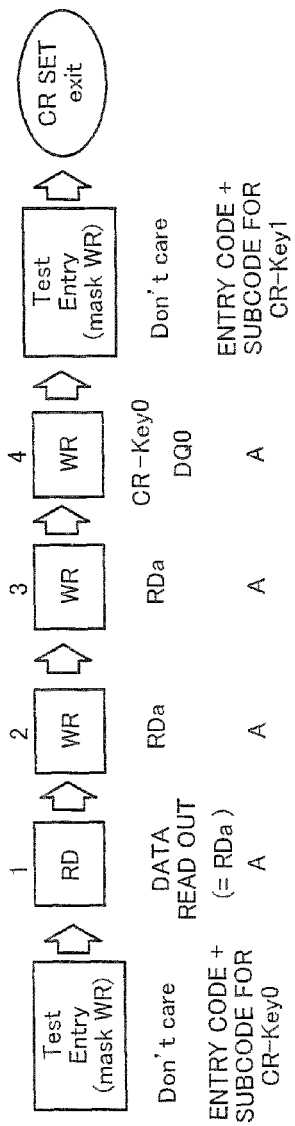
FIG. 13A
PRIOR ART
FIG. 13B
PRIOR ART

SEMICONDUCTOR MEMORY AND METHOD FOR TESTING THE SAME

CROSS-REFERENCE TO RELATED APPLICATIONS

This application is a Divisional of U.S. application Ser. No. 11/797,699 filed on May 7, 2007, which claims the benefits of priority from the prior Japanese Patent Application No. 2006-140032, filed on May 19, 2006, the entire contents of which are incorporated herein by reference.

BACKGROUND OF THE INVENTION (1) Field of the Invention

This invention relates to a semiconductor memory and a method for testing a semiconductor memory and, more particularly, to a semiconductor memory an operation mode of which can be set from the outside and a method for testing such a semiconductor memory.

(2) Description of the Related Art

In recent years pseudostatic random access memories (SRAM) in which memory cores for large-capacity low-cost dynamic random access memories (DRAM) are used and in which refresh operation can be performed inside memory elements have been used especially in portable telephones and the like.

Such a pseudostatic RAM includes a plurality of configuration registers (CR) which hold internal operation mode information by a command sent from the outside of a chip.

FIG. 10 is a view showing an example of a conventional CR setting sequence.

As shown in FIG. 10, to perform CR setting, a specific address A for register access in a memory determined by specifications is accessed in the order of steps 1 through 6. In the step 1, data RDa is read out first from the address A (RD). In the steps 2 and 3, the data RDa read out is then written to the address A in succession (WR). When memory access is performed in the order of the steps 1 through 3, the determination that a command to request entry to a CR access mode is issued is made. In and after the step 4 in which entry to the CR access mode has been made, writing data to a memory cell and reading out data from a memory cell are stopped. In the step 4, "CR set" or "CR verify" is selected by data inputted to, for example, a pad DQ0 of a plurality of data pads (used both for inputting data and for outputting data) of the semiconductor memory.

The "CR set" is the operation of writing operation mode information to a CR (updating operation mode information written to a CR). The "CR verify" is the operation of outputting operation mode information written to a CR. If the "CR set" is selected in the step 4, a plurality of CRs are set according to 8-bit data sent from the pad DQ0 and pad DQ1 through DQ7 on a time division basis at the time of performing writing operation in the steps 5 and 6. An address used at the time of performing the writing operation is also the specific address A for register access. In some cases, pieces of operation mode information set in the steps 4 through 6 are referred to as CR-Key0, CR-Key1, and CR-Key2 respectively.

By the way, the technique of a data pad compression test mode by which more chips are measured simultaneously by limited terminals (hereinafter referred to as tester pins) of a test circuit (not shown) is known as a technique for reducing the cost of testing semiconductor memories. With this technique, test data inputted to part of data pads assigned to tester pins is used for representing test data to be inputted to the other data pads not assigned to tester pins. That is to say, a plurality of data pads are compressed. By doing so, the number of tester pins assigned to data pads of one chip is reduced.

FIG. 11 is a view showing an example of data pad compression. It is assumed that out of 32 pads DQ0 through DQ31, the pads DQ0, DQ5, DQ8, and DQ13 are assigned to tester pins of a test circuit. Test data to be inputted to the other data pads is determined on the basis of test data inputted to the pads DQ0, DQ5, DQ8, and DQ13 in accordance with codes (hereinafter referred to as subcodes) inputted at the time of performing data pad compression. As shown in FIG. 11, the eight pads DQ0, DQ2, DQ4, DQ6, DQ16, DQ18, DQ20, and DQ22 can be compressed into the pad DQ0 by using subcodes a08, a09, and a10, which are part of address information, on the basis of the test data inputted to, for example, the pad DQ0. The subcodes are for designating whether the test data inputted to the pads DQ0, DQ5, DQ8, and DQ13 assigned to the tester pins should be inverted or be used in its original condition. For example, if the value of the subcode a08 is "1," then a value obtained by inverting the value inputted to the pad DQ0 is used as data to be inputted to the pads DQ2 and DQ18 in the semiconductor memory.

Such data pad compression is performed by the following data pad compression circuit included in the semiconductor memory.

FIG. 12 is a view showing part of a data pad compression circuit.

FIG. 12 shows part of a data pad compression circuit 500 used for representing data to be inputted to the pads DQ2, DQ4, D126, DQ16, DQ18, DQ20, and DQ22 by the use of the data which is inputted to the pad DQ0 and which is shown in FIG. 11.

The data pad compression circuit 500 includes switching circuits 501, 502, 503, and 504 connected to the pads DQ0, DQ2, DQ4, and DQ6 respectively. In addition, the switching circuits 502, 503, and 504 are connected to the pads DQ0 to which a tester pin is connected.

Each of the switching circuits 501, 502, 503, and 504 includes an inverting circuit Inv and two switches Sw1 and Sw2. Each switch Sw1 is used for determining whether to invert the data from the pad DQ0 by the inverting circuit Inv or to use the data from the pad DQ0 in its original condition. This determination is made according to the above subcode a08, a09, or a10. The state of the switch Sw1 included in the switching circuit 501 is fixed regardless of the value of a subcode.

Each of the switches Sw2 included in the switching circuits 502, 503, and 504 is used for selecting data from the pad DQ2, DQ4, or DQ6 or the data from the pad DQ0 (or data obtained by inverting the data from the pad DQ0) selected by each switch Sw1. When data pad compression is not performed (normal operation or the like other than test operation is performed), the data from the pad DQ2, DQ4, or DQ6 is selected. When data pad compression is performed, the data from the pad DQ0 is selected. The state of the switch Sw2 included in the switching circuit 501 is fixed an as to always select the data from the pad DQ0.

The pads DQ16, DQ18, DQ20, and DQ22 are connected to delay circuits 511, 512, 513, and 514, respectively, which delay input data by time corresponding to delays that occur in the switching circuits 501, 502, 503, and 504 respectively.

In addition, the data pad compression circuit 500 includes word structure switching circuits 521, 522, 523, 524, 525, 526, 527, and 528 for switching word structure in the semiconductor memory between 32 bits and 16 bits. When data pad compression is performed, each of switches Sw3 included in the word structure switching circuits 521 through 528 functions so as not to select the data from the pad DQ16, DQ18, DQ20, or DQ22.

With conventional semiconductor memories, the number of tester pins assigned to data pads of one chip at test time can be reduced by using the above data pad compression circuit 500.

A semiconductor integrated circuit device which can perform an operation test at an actual operation frequency by using a low-cost test circuit that provides a low-frequency test clock is disclosed in, for example, Japanese Patent Laid-Open Publication No. 2001-319500.

With the conventional semiconductor memories, however, a plurality of CRs cannot be set to desired values at test time if data pad compression is used. This problem will now be described concretely.

FIG. 13 is a view showing the operation of a conventional semiconductor memory performed in the case of combining data pad compression and CR setting.

To enter a test mode, a test start signal which is an illegal command is generated by, for example, making an output enable signal /OE and a write enable signal /WE the low (L) level and making byte mask signals /B0, /B1,_, and /Bn for controlling writing byte by byte the high (H) level. At this time the operation of writing all bit masks occurs, depending on specifications. If data pad compression is used, an address including an entry code for data pad compression and a subcode for designating CR data is inputted at the time of entering the test mode. In FIG. 13A, a CR settin sequence can progress to step 4. This is the same with FIG. 10. However, if the subcode is not variable, CR-Key1 and CR-Key2 to be inputted in steps 5 and 6 respectively may be equal to the CR-Key0 and an arbitrary change cannot be made.

Therefore, as shown in FIG. 13B, the method of entering the test mode again after the step 4 and inputting an address including a subcode for the CR-Key1 may be applied. In this case, however, the operation of writing all the bit masks occurs and writing operation is performed at addresses which do not match the specific address A for CR setting, This leads to exiting the CR setting sequence.

SUMMARY OF THE INVENTION

The present invention was made under the background circumstances described above. An object of the present invention is to provide a semiconductor memory in which a plurality of CRs for holding operation mode information can be set to arbitrary values at test time and which saves test costs.

Another object of the present invention is to provide a semiconductor memory testing method by which a plurality of CRs for holding operation mode information can be set to arbitrary values at the time of testing a semiconductor memory and which saves test costs.

In order to achieve the above first object, a semiconductor memory having an operation mode that is externally settable is provided. This semiconductor memory comprises: a plurality of registers for holding operation mode information for the semiconductor memory; a register control circuit for updating the operation mode information for each of the plurality of registers on a time division basis at the time of detecting write commands to write to an address for register access or read commands to read from the address for register access in a predetermined order; a command generation section for generating the write commands, the read commands, or a test start command by which write operation or read operation does not occur, in response to a control signal from the outside and for regenerating the test start command every update of the plurality of registers; and a data pad compression circuit for changing the operation mode information to be written to the plurality of registers by using test data inputted to part of data pads, after inverting the test data or in its original condition according to a code, as data for a rest of the data pads, the code represented by part of an address inputted at the time of the test start command being sent.

In order to achieve the above second object, a method for testing a semiconductor memory having an operation mode that is externally settable is provided. This semiconductor memory testing method comprises the steps of: generating a test start command by which write operation or read operation does not occur, in response to a control signal from the outside of the semiconductor memory; generating operation mode information by using test data inputted to part of data pads, after inverting the test data or in its original condition according to a code, as data for a rest of the data pads, the code represented by part of an address inputted at the time of the test start command being sent; writing the operation mode information generated according to the code to each of a plurality of registers on a time division basis at the time of detecting write commands to write to an address for register access or read commands to read from the address for register access in a predetermined order; and regenerating the test start command and generating operation mode information set in a register to be updated next by inputting another code, every update of the operation mode information in the plurality of registers.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 is a view showing an example of CR-Key.

FIG. 11 is a view showing an example of data pad compression.

FIGS. 13A and 13B are views showing the operation of a conventional semiconductor memory performed in the case of combining data pad compression and CR setting.

DESCRIPTION OF THE PREFERRED EMBODIMENTS

Embodiments of the present invention will now be described in detail with reference to the drawings.

Figure 1:
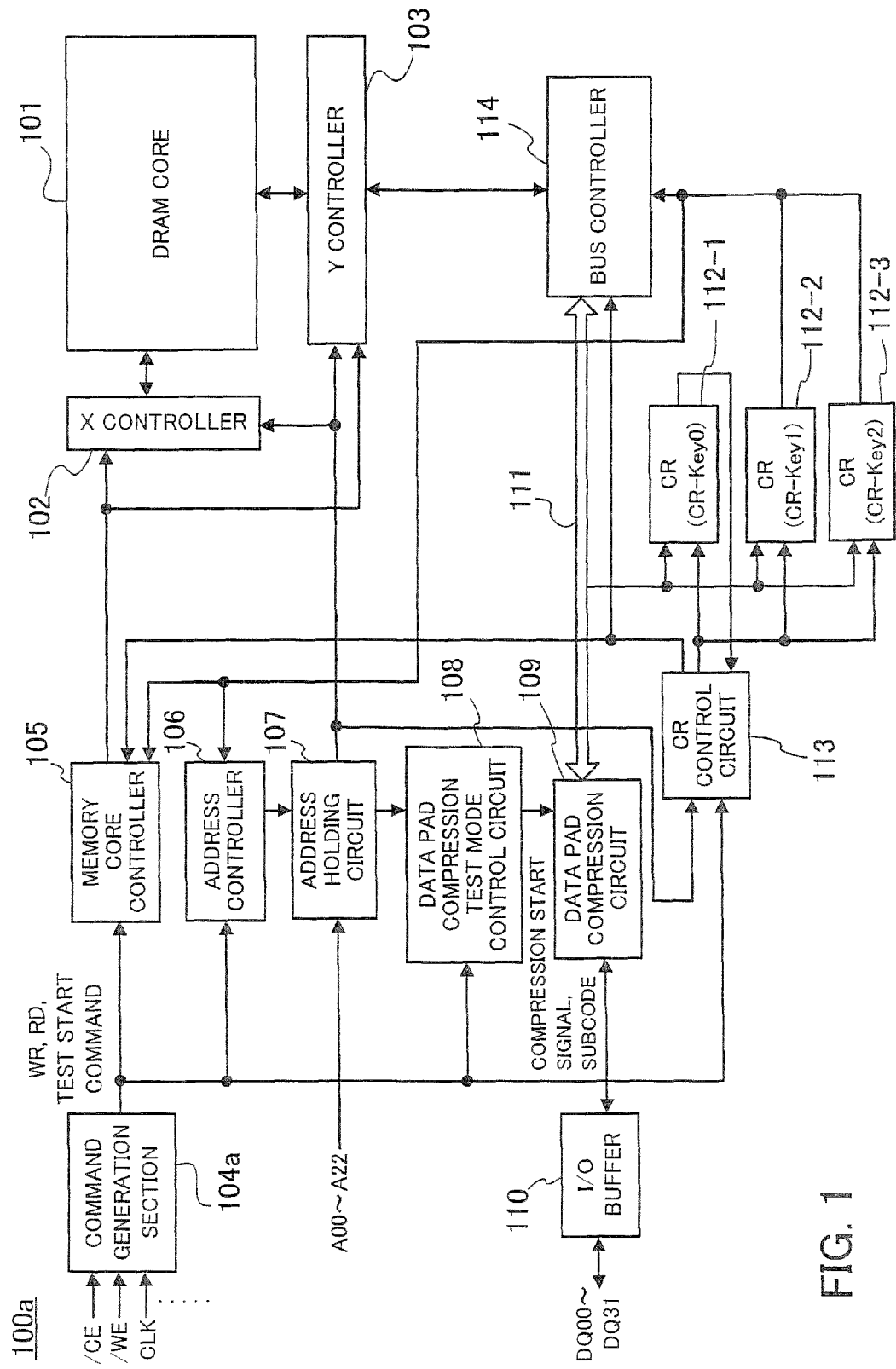
FIG. 1 is a view showing the structure of a semiconductor memory according to a first embodiment of the present invention.

FIG. 1 is a view showing the structure of a semiconductor memory according to a first embodiment of the present invention.

A semiconductor memory 100a according to a first embodiment of the present invention is, for example, a pseudostatic RAM including a DRAM core 101 and includes an X controller 102 for selecting a row of a memory cell array (not shown) and a Y controller 103 for selecting a column of the memory cell array. The Y controller 103 includes a read amplifier (no shown), a write amplifier (not shown), and the like.

In addition, the semiconductor memory 100a includes a command generation section 104a, a memory core controller 105, an address controller 106, and an address holding circuit 107.

The command generation section 104a generates a write command WR, read command RD, a test start command, or the like in response to a control signal, such as a chip enable signal ICE, a write enable signal /WE, or a clock signal CLK, sent from the outside.

It is the characteristic of the command generation section 104a included in the semiconductor memory 100a according to the first embodiment of the present invention that the command generation section 104a generates the test start command by which write operation or read operation does not occur at the time of entering a test mode. For example, generating the test start command at the time of stopping the clock signal CLK and toggling a control signal, such as the write enable signal /WE, more than one time prevents write operation and read operation from occurring.

The memory core controller 105 sends a control signal for controlling the DRAM core 101 to the X controller 102 and the Y controller 103 in accordance with a command generated by the command generation section 104a.

The address controller 106 controls the holding and outputting of an address by the address holding circuit 107 in accordance with a command generated by the command generation section 104a.

Under the control of the address controller 106, the address holding circuit 107 holds an address inputted from address input terminals AD0 through A22 and outputs the address to the X controller 102, the Y controller 103, and the like.

Furthermore, the semiconductor memory 100a which can perform data pad compression includes a data pad compression test mode control circuit 108 and a data pad compression circuit 109.

When a test start command is issued and an entry code and a subcode represented by part of an address is inputted from the address holding circuit 107, the data pad compression test mode control circuit 108 sends a compression start signal and the subcode to the data pad compression circuit 109.

Figure 12:
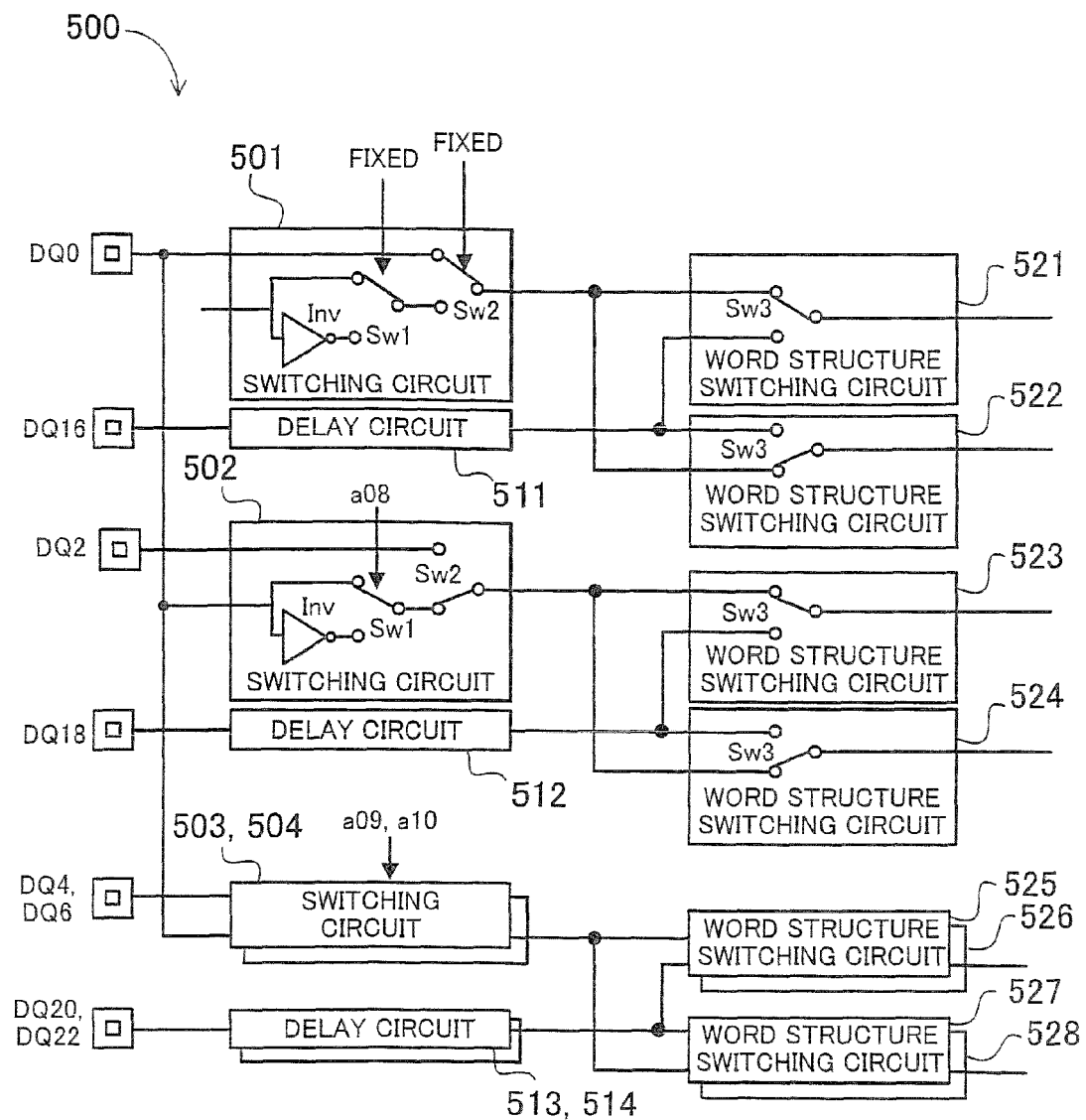
FIG. 12 is a view showing part of a data pad compression circuit.

The data pad compression circuit 109 is located between an input/output (I/O) buffer 110 connected to pads DQ00 through DQ31 for inputting/outputting data and a data bus 111. When data is inputted from the pads DQ00 through DQ31, usually the data pad compression circuit 109 sends the data to the data bus 111 in its original condition. However, when the data pad compression test mode control circuit 108 inputs a compression start command and the subcode to the data pad compression circuit 109 at test time, the data pad compression circuit 109 performs data pad compression according to the subcode. Specifically, the data pad compression circuit 109 uses test data inputted to part of the data pads, after inverting the test data or in an original condition according to the subcode, as the rest of the data pads. The concrete structure of the data pad compression circuit 109 is the same as that of the data pad compression circuit 500 shown in FIG. 12.

In addition, the semiconductor memory 100a includes CRs 112-1, 112-2, and 112-3 for holding operation mode information and a CR control circuit 113 for controlling the CRs 112-1 through and 112-3.

Hereinafter operation mode information held in the CR 112-1 will be referred to as CR-Key0, operation mode information held in the CR 112-2 will be referred to as CK-Key1, and operation mode information held in the CR 112-3 will be referred to as CR-Key2.

FIG. 2 is a view showing an example of CR-Key.

The CR-Key0 is data set especially for a pad DQ0 after the data pad compression. The operation mode "CR set" or "CR verify" is designated by the CR-Key0. If the data is "0," then the operation mode "CR verify" is designated. If the data is "1," then the operation mode "CR set" is designated.

The CR-Key1 is data set especially for the pad DQ0 and pads DQ1 through DQ4 after the data pad compression. Partial size (size of data holding area at the time of power being down) is designated by 2-bit data set for the pads DQ1 and DQ0. For example, if the 2-bit data set for the pads DQ1 and DQ0 is "00," then a partial size of 32 megabytes is designated. If the 2-bit data set for the pads DQ1 and DQ0 is "01," then a partial size of 16 megabytes is desiunated. In addition, burst length is designated by 3-bit data set for the pads DQ4, DQ3, and DQ2. For example, if the 3-bit data set for the pads DQ4, DQ3, and DQ2 is "010," then a burst length of 8 words is designated. If the 3-bit data set for the pads DQ4, DQ3, and DQ2 is "011," then a burst length of 16 words is designated.

The CR-Key2 is data set especially for the pads DQ0 through DQ2 after the data pad compression. Read latency is designated by the CR-Key2. For example, if the 3-bit data set for the pads DQ2, DQ1, and DQ0 is "010," then a read latency of 4 clocks is designated. If the 3-bit data set for the pads DQ2, DQ1, and DQ0 is "011," then a read latency of 5 clocks is designated.

These pieces of data are supplied to the memory core con roller 105, the address controller 106, and the bus controller 114.

When the CR control circuit 113 detects a write command WR to write to a specific address for register access determined by specifications outputted from the address holding circuit 107 and a read command RD to read from the specific address for register access in a predetermined order described later, the CR control circuit 113 determines that a command to request entry to a CR access mode is issued, and controls the writing of the CR-Key0, CR-Key1, and CR-Key2 to the CRs 112-1 through 112-3, respectively, on a time division basis and the outputting of the CR-Key0, CR-Key1, and CR-Key2 from the CRs 112-1 through 112-3, respectively, in the operation mode "CR verify". When entry to the CR access mode is made, the CR control circuit 113 stops the memory core controller 105 from accessing the DRAM core 101 and controls the bus controller 114 so as to write data on the data bus 111 to the CRs 112-1 through 112-3. The bus controller 114 connects the data bus 111 with the Y controller 103 in a mode other than the CR access mode.

The operation of the semiconductor memory 100a according to the first embodiment of the present invention for performing CR setting at test time by the use of data pad compression will now be described.

Figure 3:
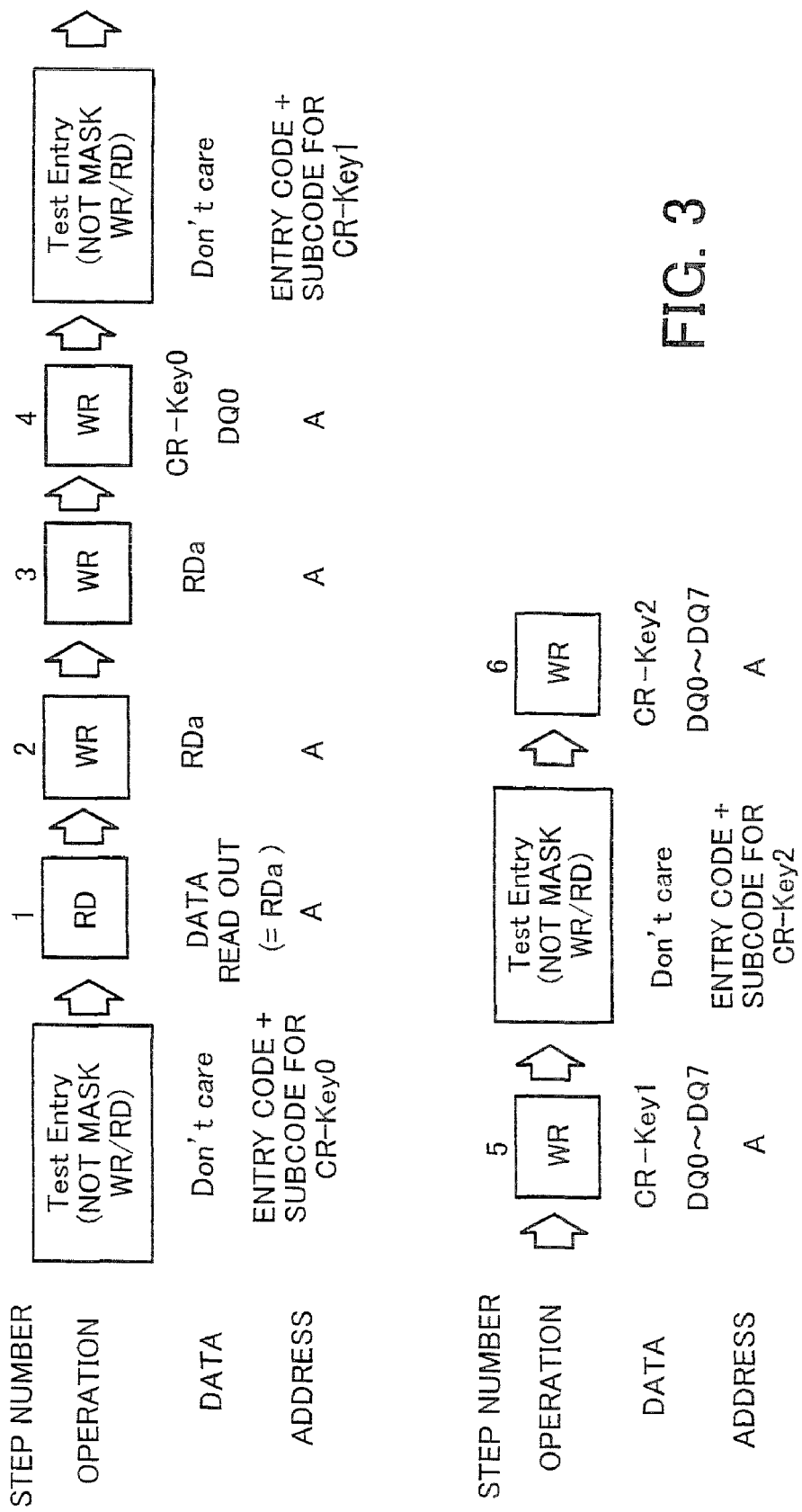
FIG. 3 is a view showing the operation at test time of the semiconductor memory according to the first embodiment of the present invention.

FIG. 3 is a view showing the operation at test time of the semiconductor memory according to the first embodiment of the present invention.

When entry to the test mode is made, the command generation section 104a generates and outputs the test start command by which write operation or read operation does not occur by, for example, stopping the clock signal CLK and toggling a control signal, such as the write enable signal /WE, more than one time. At this time the data pad compression test mode control circuit 108 accepts an address which indicates an entry code for data pad compression and a subcode for designating CR-Key0 set in the first CR 112-1 from the address holding circuit 107 and sends the compression start signal and the subcode to the data pad compression circuit 109. As a result, the data pad compression circuit 109 performs data pad compression according to the subcode and generates CR-Key0 for update on the basis of the test data inputted to the part of the data pads.

As shown in FIG. 3, a specific address A in the memory for register access determined by specifications is then accessed in the order of steps 1 to 6. In the step 1, data RDa is read out first from the address A (RD). In the steps 2 and 3, the data RDa read out is then written to the address A in succession (WR). When memory access is performed in the order of the steps 1 to 3, the CR control circuit 113 determines that a command to request entry to a CR access mode is issued, and performs the step 4.

In and after the step 4 in which entry to the CR access mode has been made, the CR control circuit 113 stops the memory core controller 105 from accessing the DRAM core 101.

In the step 4, the CR control circuit 113 writes the CR-Key0 generated by the data pad compression circuit 109 to the CR 112-1 via the data bus 111. It is assumed that the CR-Key0 is "1". That is to say, it is assumed that the operation mode "CR set" is designated. After updating the CR-Key0 in the CR 112-1 and before performing the step 5, the command generation section 104a regenerates the above test start command. At this time the address holding circuit 107 holds an address which indicates the entry code for data pad compression and a subcode for designating CR-Key1 set in the second CR 112-2. The data pad compression test mode control circuit 108 accepts this address and makes the data pad compression circuit 109 perform data pad compression according to the subcode. As a result, the data pad compression circuit 109 generates CR-Key1 for update on the basis of the test data inputted to the part of the data pads.

At this time the specific address A for register access is changed. However, the command generation section 104a generates the test start command by which write operation or read operation does not occur. Accordingly, the CR control circuit 113 can continue the CR setting sequence.

In the step 5, the specific address A for register access is used again. The CR control circuit 113 writes the CR-Key1 generated by the data pad compression circuit 109 to the CR 112-2 via the data bus 111. The command generation section 104a then regenerates the above test start command. At this time an address which indicates the entry code for data pad compression and a subcode for designating CR-Key2 set in the third CR 112-3 is inputted to the data pad compression test mode control circuit 108. The data pad compression circuit 109 generates CR-Key2 for update according to the subcode.

After that, the above address is changed to the specific address A for register access again. The CR control circuit 113 writes the CR-Key2 generated by the data pad compression circuit 109 to the CR 112-3 via the data bus As has been described, with the semiconductor memory 100a according to the first embodiment of the present invention data pad compression is used at test time. As a result, a test can be performed with a small number of tester pins. Therefore, the number of the semiconductor memories 100a which can be tested at the same time can be increased and a test cost can be reduced. In addition, the use of data pad compression does not lead to exiting a CR setting sequence and arbitrary CR-Key0, CR-Key1, and CR-Key2 can be set in the CRs 112-1 through 112-3 respectively.

A semiconductor memory according to a second embodiment of the present invention will now be described.

With the above semiconductor memory 100a according to the first embodiment of the present invention a test start signal by which write operation or read operation does not occur is generated at the time of entering the test mode by, for example, stopping the clock signal CLK. A change in control signal, such as clock signal, has an influence on the whole of test processes. Accordingly, if a chip other than the above semiconductor memory 100a is also tested at the same time, a change in test circuit program and the like may be needed. This leads to an increase in the number of the test processes. With the following semiconductor memory according to the second embodiment of the present invention a conventional test start signal is used for realizing the coexistence of data pad compression and CR setting.

Figure 4:
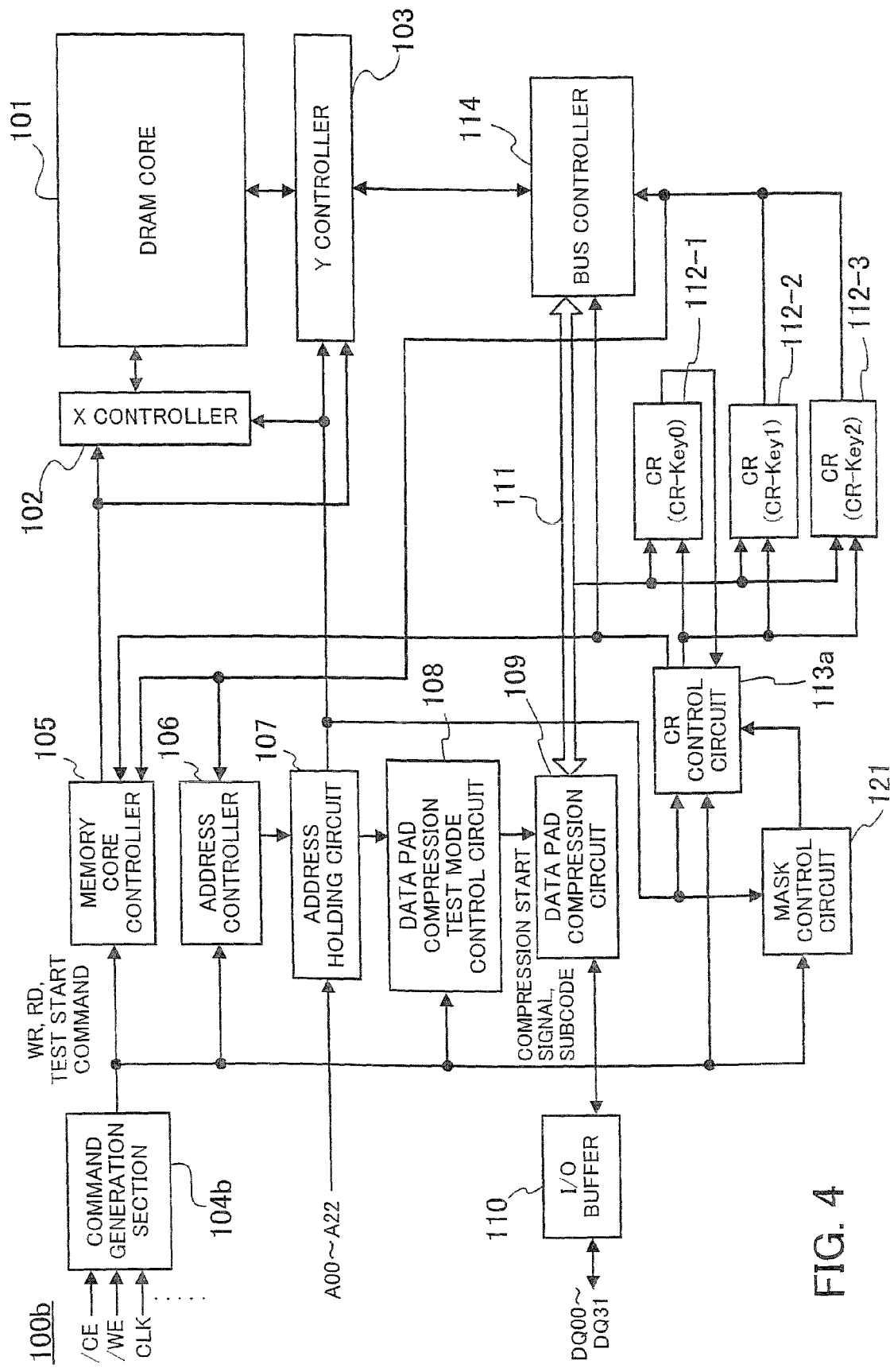
FIG. 4 is a view showing the structure of a semiconductor memory according to a second embodiment of the present invention.

FIG. 4 is a view showing the structure of the semiconductor memory according to the second embodiment of the present invention.

Components in FIG. 4 that are the same as those of the semiconductor memory 100a according to the first embodiment of the present invention shown in FIG. 1 are marked with the same symbols and descriptions of them will be omitted.

A semiconductor memory 100b according to the second embodiment of the present invention differs from the semiconductor memory 100a according to the first embodiment of the present invention in that write operation or read operation is permitted by a test start command generated by a command generation section 104b (this is the same with conventional test start commands) and that it includes a mask control circuit 121. Moreover, a CR control circuit 113a included in the semiconductor memory 100b according to the second embodiment of the present invention differs from the CR control circuit 113 included in the semiconductor memory 100a according to the first embodiment of the present invention.

The mask control circuit 121 generates a mask signal and sends the mask signal to the CR control circuit 113a. When the CR control circuit 113a updates CR-Key0, CR-Key1, and CR-Key2 set in CRs 112-1 through 112-3 respectively, updating a CR-key only in one unupdated CR is permitted. The CR control circuit 113a skips the updating of CR-Keys in the other CRs.

When the CR control circuit 113a detects a write command WR to write to an address for register access and a read command RD to read from the address for register access in the order shown in FIG. 3, the CR control circuit 113a skips the updating of the CR-Keys in the CRs designated by the mask signal and performs the update process of writing a CR-Key generated according to a subcode to the CR permitted by the mask signal.

Figure 5:
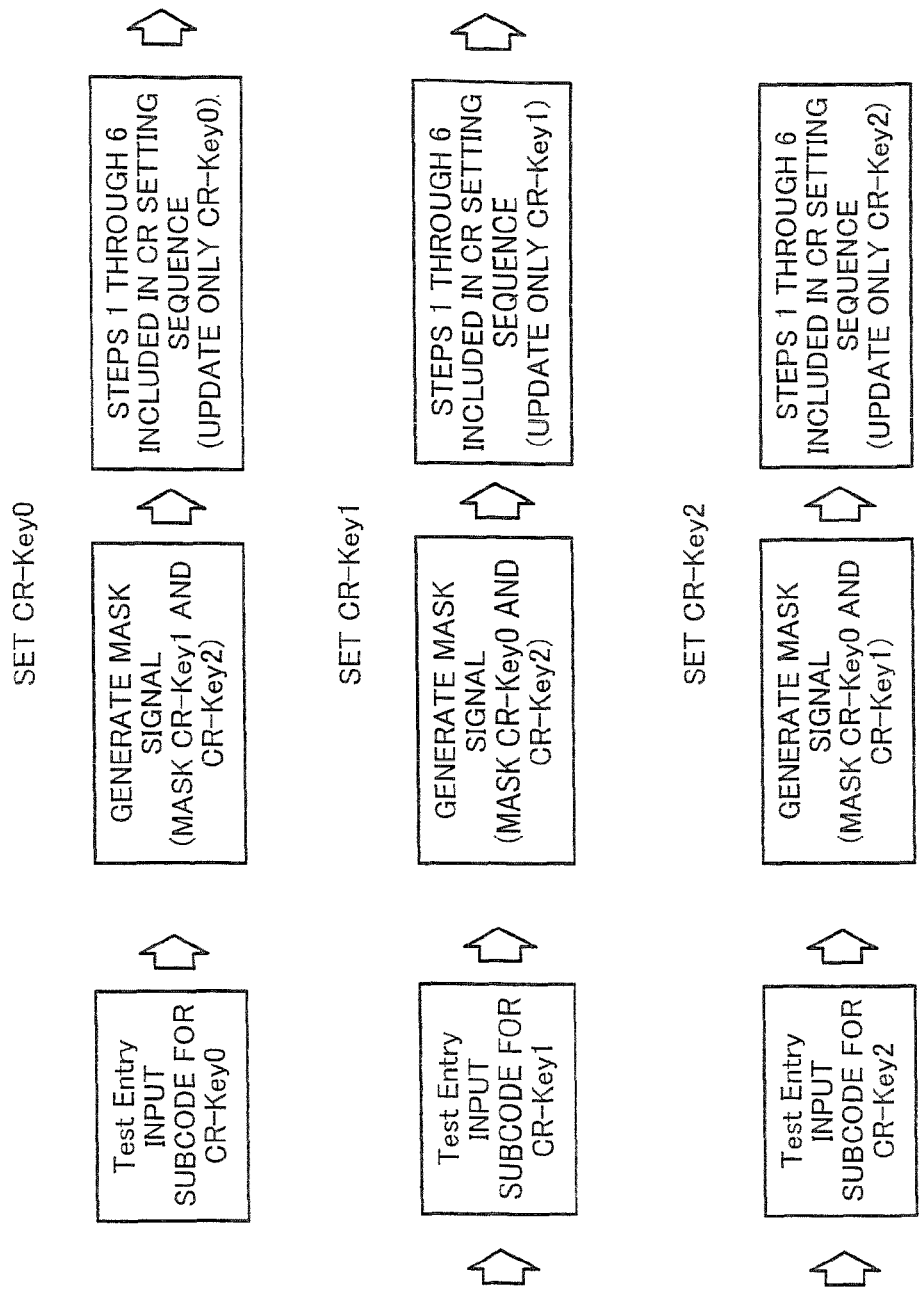
FIG. 5 is a view showing the operation at test time of the semiconductor memory according to the second embodiment of the present invention.

FIG. 5 is a view showing the operation at test time of the semiconductor memory according to the second embodiment of the present invention.

To update the CR-Key0 set in the CR 112-1 first, the command generation section 104b generates and sends a test start command at entering a test mode. At this time a data pad compression test mode control circuit 108 accepts an address which indicates an entry code for data pad compression and a subcode for designating CR-Key0 set in the first CR 112-1 from an address holding circuit 107 and sends a compression start signal and the subcode to a data pad compression circuit 109. As a result, the data pad compression circuit 109 performs data pad compression according to the subcode and generates CR-Key0 for update.

After that, the above address is changed to the specific address for register access determined by specifications. The mask control circuit 121 first generates a mask signal for skipping the updating of the CR-Key) and the CR-Key2 and sends the mask signal to the CR control circuit 113a. The CR control circuit 113a performs the above CR setting sequence including the steps 1 through 6 and writes the CR-Key0 for update generated to the CR 112-1. However, the updating of the CR-Key1 and the CR-Key2 set in the CRs 112-2 and 112-3, respectively, is skipped by the mask signal. When the step 6 is completed, the CR setting sequence ends.

The CR-Key1 and the CR-Key2 are not yet updated. Therefore, to enter the test mode again, the command generation section 104b generates a test start command again after the CR-Key0 is updated. At this time the data pad compression test mode control circuit 108 accepts an address which indicates the entry code for data pad compression and a subcode for designating CR-Key1 set in the second CR 112-2 from the address holding circuit 107 and sends a compression start signal and the subcode to the data pad compression circuit 109. As a result, the data pad compression circuit 109 performs data pad compression according to the subcode and generates CR-Key1 for update.

After that, the above address is changed to the specific address for register access determined by the specifications. The mask control circuit 121 then (generates a mask signal for skipping the updating of the CR-Key0 and the CR-Key2 and sends the mask signal to the CR control circuit 113a. The CR control circuit 113a performs a CR setting sequence including steps 1 through 6 and writes the CR-Key1 for update generated to the CR 112-2. However, the updating of the CR-Key0 and the CR-Key2 set in the CRs 112-1 and 112-3, respectively, is skipped by the mask signal. When the step 6 is completed, the CR setting sequence ends.

The CR-Key2 is not yet updated. Therefore, to enter the test mode, the command generation section 104b generates a test start command again after the CR-Key 1 is updated. At this time the data pad compression test mode control circuit 108 accepts an address which indicates the entry code for data pad compression and a subcode for designating CR-Key2 set in the third CR 112-3 from the address holding circuit 107 and sends a compression start signal and the subcode to the data pad compression circuit 109. As a result, the data pad compression circuit 109 performs data pad compression according to the subcode and generates CR-Key2 for update.

After that, the above address is changed to the specific address for register access determined by the specifications. The mask control circuit 121 then generates a mask signal for skipping the updating of the CR-Key0 and the CR-Key1 and sends the mask signal to the CR control circuit 113a. The CR control circuit 113a performs a CR setting sequence including steps 1 through 6 and writes the CR-Key2 for update generated to the CR 112-2. However, the updating of the CR-Key0 and the CR-Key1 set in the CRs 112-1 and 112-2, respectively, is skipped by the mask signal. When the step 6 is completed, the CR setting sequence ends.

By adopting the above method, data pad compression can be applied and the CR-Key0, the CR-Key1, and the CR-Key2 can be changed to arbitrary values at test time. With the above semiconductor memory 100b according to the second embodiment of the present invention the test start signal is not changed. The semiconductor memory 100b according to the second embodiment of the present invention differs from the semiconductor memory 100a according to the first embodiment of the present invention in this respect. As a result, changes of specifications for test processes can be reduced.

A semiconductor memory according to a third embodiment of the present invention will now be described.

Figure 6:
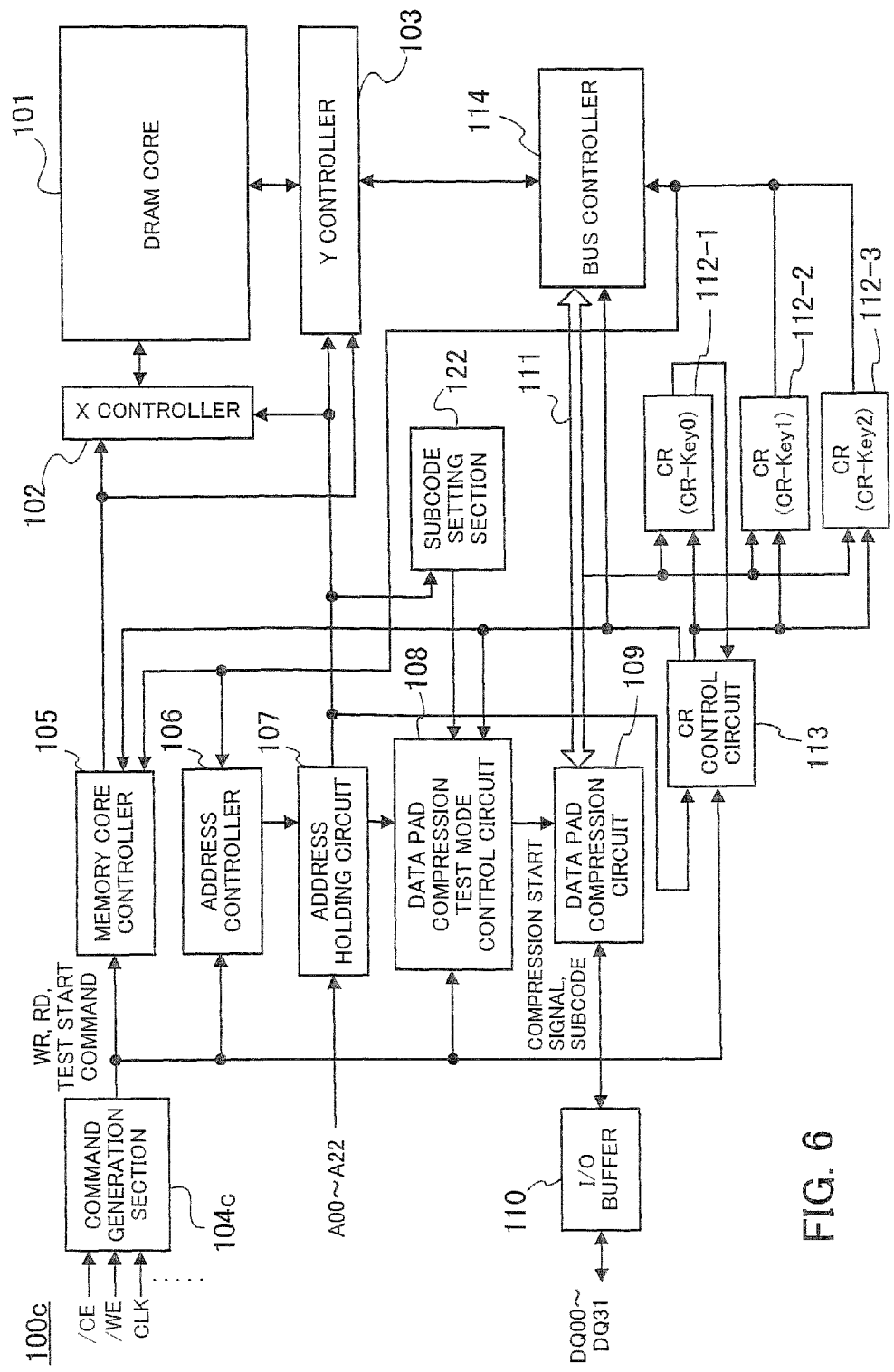
FIG. 6 is a view showing the structure of a semiconductor memory according, to a third embodiment of the present invention.

FIG. 6 is a view showing the structure of a semiconductor memory according to a third embodiment of the present invention.

Components in FIG. 6 that are the same as those of the semiconductor memory 100a according to the first embodiment of the present invention shown in FIG. 1 are marked with the same symbols and descriptions of them will be omitted.

A semiconductor memory 100c according to the third embodiment of the present invention differs from the semiconductor memory 100a according to the first embodiment of the present invention in that write operation or read operation is permitted by a test start command generated by a command generation section 104c (this is the same with conventional test start commands) and that it includes a subcode setting section 122.

The subcode setting section 122 accepts and stores subcodes for chanaing CR-Key before CR-Key0, CR-Key and CR-Key2 are updated. The number of the subcodes corresponds to that of CRs 112-1 through 112-3.

Figure 7:
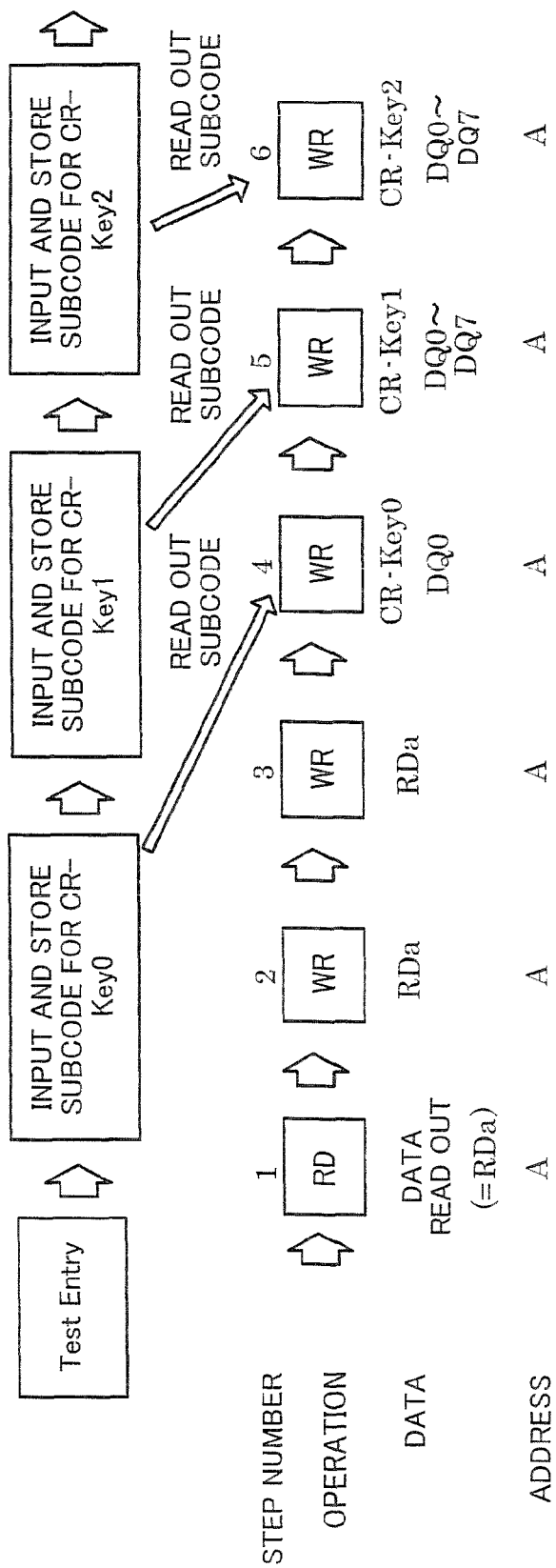
FIG. 7 is a view showing the operation at test time of the semiconductor memory according to the third embodiment of the present invention.

FIG. 7 is a view showing the operation at test time of the semiconductor memory according to the third embodiment of the present invention.

With the semiconductor memory 100c according to the third embodiment of the present invention, addresses each of which includes a subcode and the number of which corresponds to the number of the CRs 112-1 through 112-3 are inputted before the beginning of a CR setting sequence including steps 1 through 6 when entry to a test mode is made. The subcode setting section 122 stores a subcode for the CR-Key0, a subcode for the CR-Key1, and a subcode for the CR-Key2. When the CR-Key0 is updated (step 4) in the CR setting sequence including the steps 1 through 6, a data pad compression test mode control circuit 108 reads out the subcode for the CR-Key0 stored in the subcode setting section 122 and inputs the subcode for the CR-Key0 to a data pad compression circuit 109, under the control of a CR control circuit 113. The data pad compression circuit 109 generates CR-Key0 for update. Similarly, when the CR-Key1 is updated (step 5), the data pad compression test mode control circuit 108 reads out the subcode for the CR-Key1 and inputs the subcode for the CR-Key1 to the data pad compression circuit 109. The data pad compression circuit 109 generates CR-Key1 for update. When the CR-Key2 is updated (step 6), the data pad compression test mode control circuit 108 reads out the subcode for the CR-Key2 and inputs the subcode for the CR-Key2 to the data pad compression circuit 109. The data pad compression circuit 109 generates CR-Key2 for update. As a result, all of the CR-Key0, the CR-Key1, and the CR-Key2 can be updated.

With the above semiconductor memory 100c according to the third embodiment of the present invention, the coexistence of data pad compression and CR setting can be realized at test time. Furthermore, with the above semiconductor memory 100c according to the third embodiment of the present invention a CR setting sequence is performed only once. Therefore, compared with the semiconductor memory 100b according to the second embodiment of the present invention, time taken to perform CR setting can be reduced.

A semiconductor memory according to a fourth embodiment of the present invention will now be described.

Figure 8:
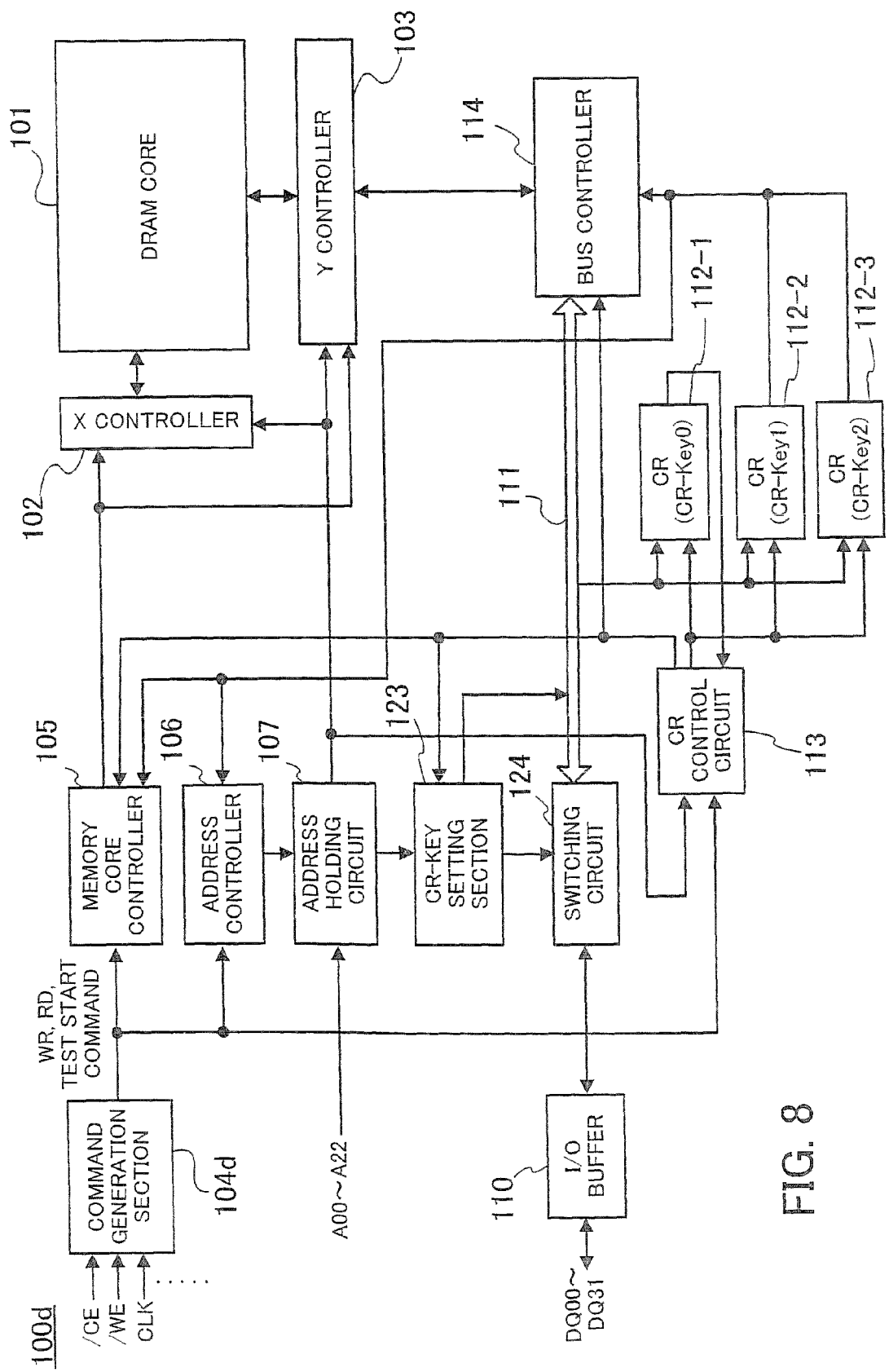
FIG. 8 is a view showing the structure of a semiconductor memory according to a fourth embodiment of the present invention.

FIG. 8 is a view showing the structure of a semiconductor memory according to a fourth embodiment of the present invention.

Components in FIG. 8 that are the same as those of the semiconductor memory 100a according to the first embodiment of the present invention shown in FIG. 1 are marked with the same symbols and descriptions of them will be omitted.

With a semiconductor memory 100d according to the fourth embodiment of the present invention write operation or read operation is permitted by a test start command generated by a command generation section 104d. This is the same with the semiconductor memories 100b and 100c according to the second and third embodiments, respectively, of the present invention.

The semiconductor memory 100d according to the fourth embodiment of the present invention includes a CR-Key setting section 123 in place of the data pad compression test mode control circuit 108 and includes a switching circuit 124 in place of the data pad compression circuit 109.

The CR-Key setting section 123 previously accepts and stores CR-Keys (CR-Key0, CR-Key1, for update the number of which corresponds to the number of CRs 112-1 through 112-3. The CR-Keys for update are acquired from, for example, part of address information inputted from an address holding circuit 107. The CR-Keys for update are stored before a CR control circuit 113 performs a CR setting sequence.

If the CR-Keys for update are read out from the CR-Key setting section 123 to a data bus 111 at the time of performing the CR setting sequence, then the switching circuit 124 intercepts data sent from an I/O buffer 110.

Figure 9:
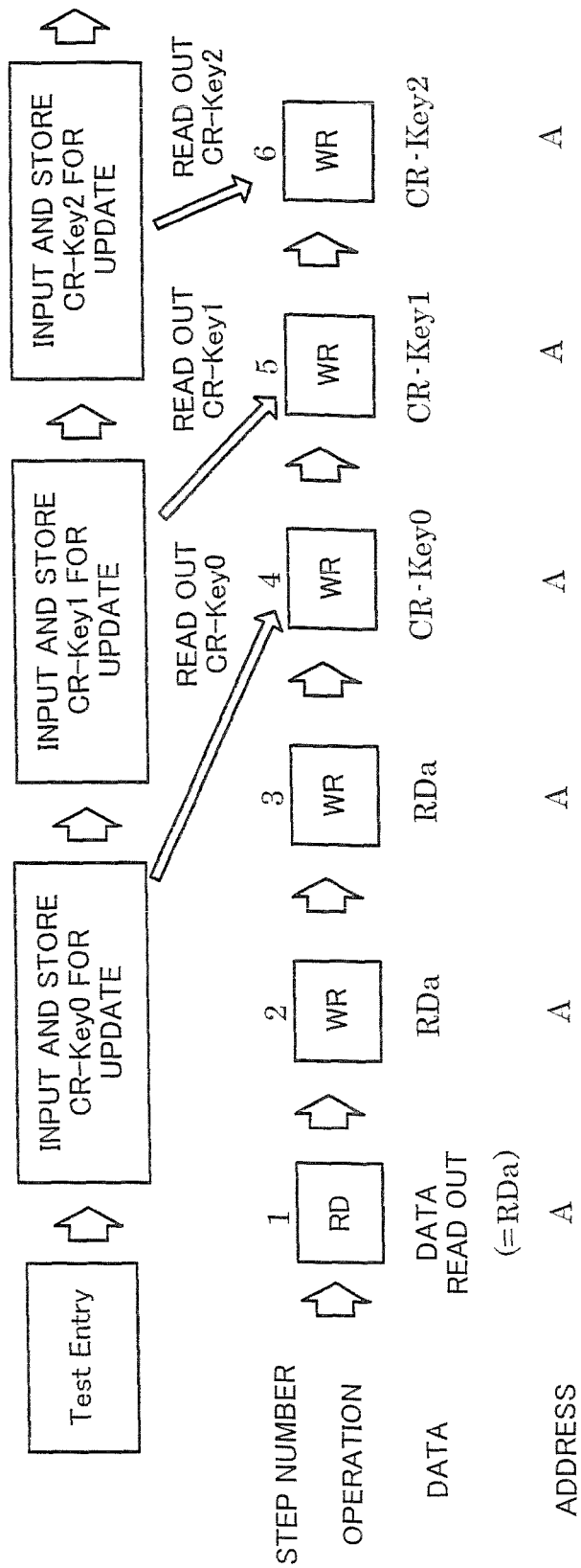
FIG. 9 is a view showing the operation at test time of the semiconductor memory according to the fourth embodiment of the present invention.
Figure 10:
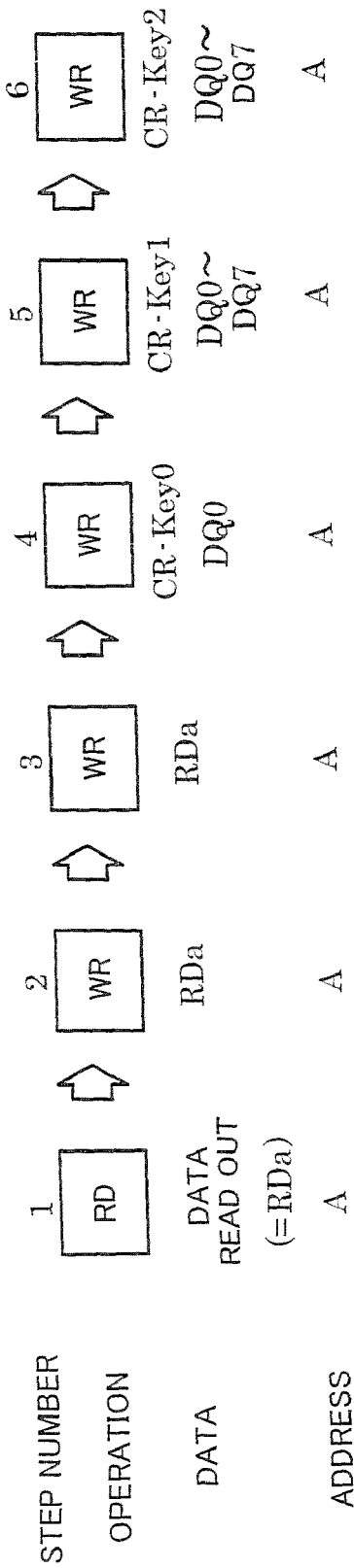
FIG. 10 is a view showing an example of a conventional CR setting sequence.

FIG. 9 is a view showing the operation at test time of the semiconductor memory according to the fourth embodiment of the present invention.

With the semiconductor memory 100d according to the fourth embodiment of the present invention, the CR-Key setting section 123 accepts and stores the CR-Keys for update before the beginning of a CR setting sequence including steps 1 through 6 when entry to a test mode is made. When CR-Key0 is updated (step 4) in the CR setting sequence including the steps 1 through 6, the CR-Key setting section 123 reads out the CR-Key0 for update and writes the CR-Key0 for update to the CR 112-1 via the data bus 111. Similarly, when CR-Key1 is updated (step 5), the CR-Key setting section 123 reads out the CR-Key1 for update and writes the CR-Key1 for update to the CR 112-2. When CR-Key2 is updated (step 6), the CR-Key setting section 123 reads out the CR-Key2 for update and writes the CR-Key2 for update to the CR 112-3. By performing the above process, all of the CR-Key0 the CK-Key, and the CR-Key2 can be updated.

With the above semiconductor memory 100d according to the fourth embodiment of the present invention, the CR-Keys for update to be written to the CRs 112-1 through 112-3 in the CR setting sequence are stored in the CR-Key setting section 123. When the CR setting sequence is performed, the CR-Keys for update are read out and set. Therefore, when the CR setting sequence is performed, there is no need to connect data pads to tester pins. As a result, a test cost can be reduced without using a data pad compression technique.

With the above semiconductor memories 100a, 100b, 100c, and 100d according to the first through fourth embodiments, respectively, of the present invention, the three CRs and the three CR-Keys are used. However, the number of CRs and the number of CR-Keys are not limited to three and may be larger than three.

In the present invention arbitrary values can be set in the plurality of registers for holding operation mode information at the tulle of testing the semiconductor memory. In addition, a test can be performed with a small number of tester pins. Accordingly, the number of semiconductor memories which are tested at the same time can be increased and a test cost can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory having an operation mode externally settable, the memory comprising:
   a plurality of registers for holding operation mode information for the semiconductor memory;
   a command generation section for generating a test start command in response to a control signal externally inputted;
   a data pad compression circuit for generating the operation mode information to be written to the plurality of registers by using test data inputted to part of data pads, after inverting the test data or in its original condition according to a code, as data for a rest of the data pads, the code represented by part of an address inputted at the time of the test start command being sent;
   a mask control circuit for generating a mask signal by which only updating of the operation mode information in an unupdated register out of the plurality of registers is permitted and the updating of the operation mode information in remaining registers out of the plurality of registers is skipped, at the time of updating the operation mode information; and
   a register control circuit for performing an update process in which the updating of the operation mode information in the remaining registers designated by the mask signal is skipped and the operation mode information generated according to the code is written to the unupdated register permitted by the mask signal, at the time of detecting write commands to write to an address for register access or read commands to read from the address for register access in a predetermined order,
   wherein:
   the command generation section generates the test start command again if there is an unupdated register out of the plurality of registers after the update process;
   the data pad compression circuit inputs another code and changes the operation mode information; and
   the register control circuit performs the update process by using the operation mode information changed.

2. The semiconductor memory according to claim 1, wherein the operation mode information is partial size, burst length, or read latency of the semiconductor memory.

3. A method for testing a semiconductor memory having an operation mode externally settable, the method comprising the steps of:

generating a test start command in response to a control signal from an outside of the semiconductor memory;

generating operation mode information by using test data inputted to part of data pads, after inverting the test data or in its original condition according to a code, as data for a rest of the data pads, the code represented by part of an address inputted at the time of the test start command being sent;

generating a mask signal by which only updating of the operation mode information in an unupdated register out of the plurality of registers is permitted and the updating of the operation mode information in remaining registers out of the plurality of registers is skipped, at the time of updating the operation mode information held in the plurality of registers;

performing an update process in which the updating of the operation mode information in the remaining registers designated by the mask signal is skipped and the operation mode information generated according to the code is written to the unupdated register permitted by the mask signal, at the time of detecting write commands to write to an address for register access or read commands to read from the address for register access in a predetermined order; and generating the test start command again in a case where there is an unupdated register out of the plurality of registers after the update process, inputting another code and changing the operation mode information, and performing the update process by using the operation mode information changed.

4. The method according to claim 3, wherein the operation mode information is partial size, burst length, or read latency of the semiconductor memory.

* * * * *